(12) United States Patent
Rossmann et al.

(10) Patent No.: US 7,825,657 B2
(45) Date of Patent: Nov. 2, 2010

(54) MAGNETIC FIELD SENSOR AND METHOD FOR THE OPERATION THEREOF

(75) Inventors: Siegfried Rossmann, Kuehnsdorf (AT); Colin Steele, Edinburgh (GB)

(73) Assignee: Austriamicrosystems AG, Unterpremstätten (AT)

( * ) Notice: Subject to any disclaimer, the term of this patent is extended or adjusted under 35 U.S.C. 154(b) by 620 days.

(21) Appl. No.: 10/591,976

(22) PCT Filed: Jan. 11, 2005

(86) PCT No.: PCT/EP2005/000176

§ 371 (c)(1),
(2), (4) Date: Jul. 26, 2007

(87) PCT Pub. No.: WO2005/085892

PCT Pub. Date: Sep. 15, 2005

(65) Prior Publication Data

US 2007/0279044 A1 Dec. 6, 2007

(30) Foreign Application Priority Data

Mar. 2, 2004 (DE) .................. 10 2004 010 613

(51) Int. Cl.
*G01R 33/07* (2006.01)
(52) U.S. Cl. ........................ 324/251; 327/510
(58) Field of Classification Search ............ 324/207.12, 324/207.2, 207.21, 207.25, 251, 252, 253; 327/510, 511
See application file for complete search history.

(56) References Cited

U.S. PATENT DOCUMENTS

| | | | |
|---|---|---|---|
| 4,752,733 A | * | 6/1988 | Petr et al. ................ 324/225 |
| 5,426,364 A | | 6/1995 | Yi et al. |
| 5,477,135 A | | 12/1995 | Baker et al. |
| 5,489,846 A | | 2/1996 | Li et al. |
| 5,604,433 A | | 2/1997 | Theus |
| 5,880,586 A | | 3/1999 | Dukart et al. |

(Continued)

FOREIGN PATENT DOCUMENTS

DE  44 22 868 A1  1/1996

(Continued)

OTHER PUBLICATIONS

Demierre, Michel, Improvements of CMOS Hall Microsystems and Applications for Absolute Angular Position Measurements, University These for Institute of Microelectronics and Microsystems, dated Sep. 2003.*

(Continued)

*Primary Examiner*—Kenneth J Whittington
(74) *Attorney, Agent, or Firm*—Cohen Pontani Lieberman & Pavane LLP

(57) ABSTRACT

A magnetic field sensor comprising a sensor arrangement (H), which is supplied by a supply device (IH) and generates a sensor signal. An evaluation device (ADC, R) to which the sensor signal is fed and which outputs a first output signal (AI). A feedback device (RV) to which the first output signal is fed and which controls the supply device. The regulation of the control loop closed with the feedback device improves the noise behavior of the magnetic field sensor. A method is disclosed for operating the magnetic field sensor.

13 Claims, 2 Drawing Sheets

U.S. PATENT DOCUMENTS 6,969,988 B2 * 11/2005 Kakuta et al. .......... 324/207.25

FOREIGN PATENT DOCUMENTS

| DE | 44 31 703 A1 | 3/1996 |
| DE | 195 43 562 A1 | 5/1996 |
| DE | 100 14 094 A1 | 4/2001 |
| DE | 101 54 498 A1 | 5/2003 |
| EP | 0 525 235 B1 | 7/1991 |
| EP | 0 916 074 B1 | 5/1998 |
| WO | WO 03/081182 * | 10/2003 |

OTHER PUBLICATIONS

Wu, C.S. et al., "Modified Vector Rotational CORDIC (MVR-CORDIC) Algorithm and Architecture", IEEE Transactions on Circuits and Systems II: Analog and Digital Signal Processing, vol. 48, No. 6, pp. 548-561, Jun. 2001.

* cited by examiner

MAGNETIC FIELD SENSOR AND METHOD FOR THE OPERATION THEREOF

RELATED APPLICATIONS

This is a U.S. national stage of International Application No. PCT/EP2005/000176, filed on Jan. 11, 2005.

This patent application claims the priority of German patent application no. 10 2004 010 613.4 filed Mar. 2, 2004, the disclosure content of which is hereby incorporated by reference.

FIELD OF THE INVENTION

The invention relates to a magnetic field sensor comprising a sensor arrangement, which is supplied by a supply device and generates a sensor signal, and comprising an evaluation device, to which the sensor signal is fed and which outputs an output signal. The invention furthermore relates to a method for the operation of the magnetic field sensor.

BACKGROUND OF THE INVENTION

Such a magnetic field sensor, known from EP 0525235 B1, has a self-compensation that obviates individual adjustment measures of the magnetic field sensor by means of a thermal and technological coupling of a Hall element and its supply devices. For this purpose, the corresponding elements are embodied jointly in an integrated circuit.

A further magnetic field sensor of the aforementioned type is known from DE 4431703 A1, wherein a magnetic field sensor is proposed which, besides a compensation of the offset of the Hall element, concomitantly takes account of the offset of the evaluation device connected downstream and thus enables a greater accuracy.

Hall elements are typical sensor elements which can be used to construct a magnetic field sensor and which usually interact in an array or a Hall element arrangement. A Hall element outputs a voltage signal in the magnetic field as a Hall signal if a current flows through it perpendicular to the magnetic field. The Hall signal, that is to say the Hall voltage, is dependent on the product of the vertical component of the magnetic flux density, the Hall current and the Hall constant. The Hall constant, which specifies the sensitivity of the Hall element, is material-dependent.

During operation in practice, a noise voltage composed of noise components of the Hall element and the downstream evaluation device is superposed on the useful signal of the Hall voltage formed from the Hall constant of the component, the vertical component of the magnetic flux density and the Hall current. Noise components of this type may result from temperature and material dependence.

Further components of the noise signal may arise from the concrete application. Thus, EP 0916074 B1 specifies a magnetic rotation sensor, in which a magnet mounted on an axis is arranged above a Hall element array. The Hall element arrangement itself comprises a number of individual sensor elements which are in a specific geometrical arrangement with respect to one another. The evaluation device connected downstream of the Hall element array determines the rotation angle of the axis from the Hall signal of the Hall element. Different temperature responses of the magnet and of the Hall element and also different distances between these two elements influence the useful signal, in particular. The distance between useful signal and noise signal is thereby altered.

If the Hall signal is digitized for the purpose of digital further processing, the dynamic range of the analog-to-digital converter that performs the digitization cannot be fully exhausted on account of the changes in the useful signal amplitude of the Hall signal.

SUMMARY OF THE INVENTION

One object of the invention is to provide a magnetic field sensor and a method for the operation thereof which result in a better behavior of the magnetic field sensor.

This and other objects are attained in accordance with one aspect of the invention directed to a magnetic field sensor. A sensor arrangement is supplied by a supply device and generates a sensor signal. An evaluation device to which the sensor signal is fed, outputs a first output signal corresponding to the amplitude of the sensor signal. A feedback device, to which the first output signal is fed, controls the supply device such that the first output signal remains substantially constant.

The invention is based on the concept of conditioning the sensor signal or the output signal of the evaluation device of the magnetic field sensor and generating a control signal with the aid of a feedback device, by means of which control signal the magnitude of the supply current or of the supply voltage can be altered. For this purpose, preferably, the amplitude of the sensor signal is determined and the supply current or the supply voltage of the sensor arrangement is set in a closed control loop such that the amplitude of the sensor signal remains constant.

It is particularly advantageous that by means of a magnetic field sensor of this type and by means of the method for the operation thereof, it is possible to generate an output signal of the magnetic field sensor which has an optimized signal-to-noise ratio.

It is furthermore advantageous that the analog-to-digital converter (ADC) required in the case of digital further processing of the sensor signal may have a smaller bit width than would be necessary without the regulation. The ADC can thus be constructed more simply and more cost-effectively.

It is particularly advantageous if the output signal of the evaluation device corresponds to the amplitude of the sensor signal and said amplitude is determined by a comparison with a desired amplitude value. The supply current or the supply voltage is then set by means of the amplification device such that the amplitude of the sensor signal remains constant.

In one embodiment of the magnetic field sensor comprising Hall elements, the individual elements of the Hall element arrangement are preferably arranged such that they generate two measurement signals that are phase-shifted by 90°; in particular, the Hall elements are arranged in a manner offset by 90° with respect to one another. In the case of a rotation angle sensor, the amplitude of the Hall signal can then be determined in a simple manner. Given a sinusoidal profile of the two phase-shifted measurement signals, the amplitude can be generated by squaring each measurement signal and subsequently adding the squared signals.

One advantageous configuration provides for the measurement signals of the sensor arrangement to be digitized and processed further in a computation device. The computation device generates on the one hand the desired output signal, for example the rotation angle, and on the other hand the amplitude information for the sensor signal.

In one particularly preferred embodiment, it is provided that the feedback device contains a comparator, which compares the amplitude signal of the magnetic field sensor with a reference value, that a counter is connected downstream of the comparator, which counter effects up-counting or down-counting depending on the output signal of the comparator, and that the value of the counter is converted into a control signal for the supply current or the supply voltage by means of a digital-to-analog converter (DAC).

A further advantageous configuration provides for the supply current or the supply voltage to be composed of a DC component and a controllable component, e.g. a DC current of a constant-current source and the current of a controlled current source, the controlled component being controlled by the feedback or amplification device. In this way, the function of the magnetic field sensor is ensured if the controlled component is not driven.

A further advantageous configuration of the invention provides for using and conditioning the control signals for the counter provided in the feedback path as status information. In this way, it is possible to ascertain the status of the control device, in particular the increase or decrease in the control information of the controlled component and thus the amplitude of the sensor signal or an overflow of the counter and thus a departure from the control range of the magnetic field sensor. Furthermore, with status information of this type, it is possible to use a dynamic identification of a "pushbutton" function independently of the absolute value.

BRIEF DESCRIPTION OF THE DRAWINGS

The invention is explained in more detail below on the basis of exemplary embodiments and associated Figures of the drawing. The Figures serve solely for illustrating the invention and are therefore represented only schematically and not true to scale. Identical or identically acting elements are provided with identical reference symbols. In the Figures.

DETAILED DESCRIPTION OF THE DRAWINGS

Figure 1:
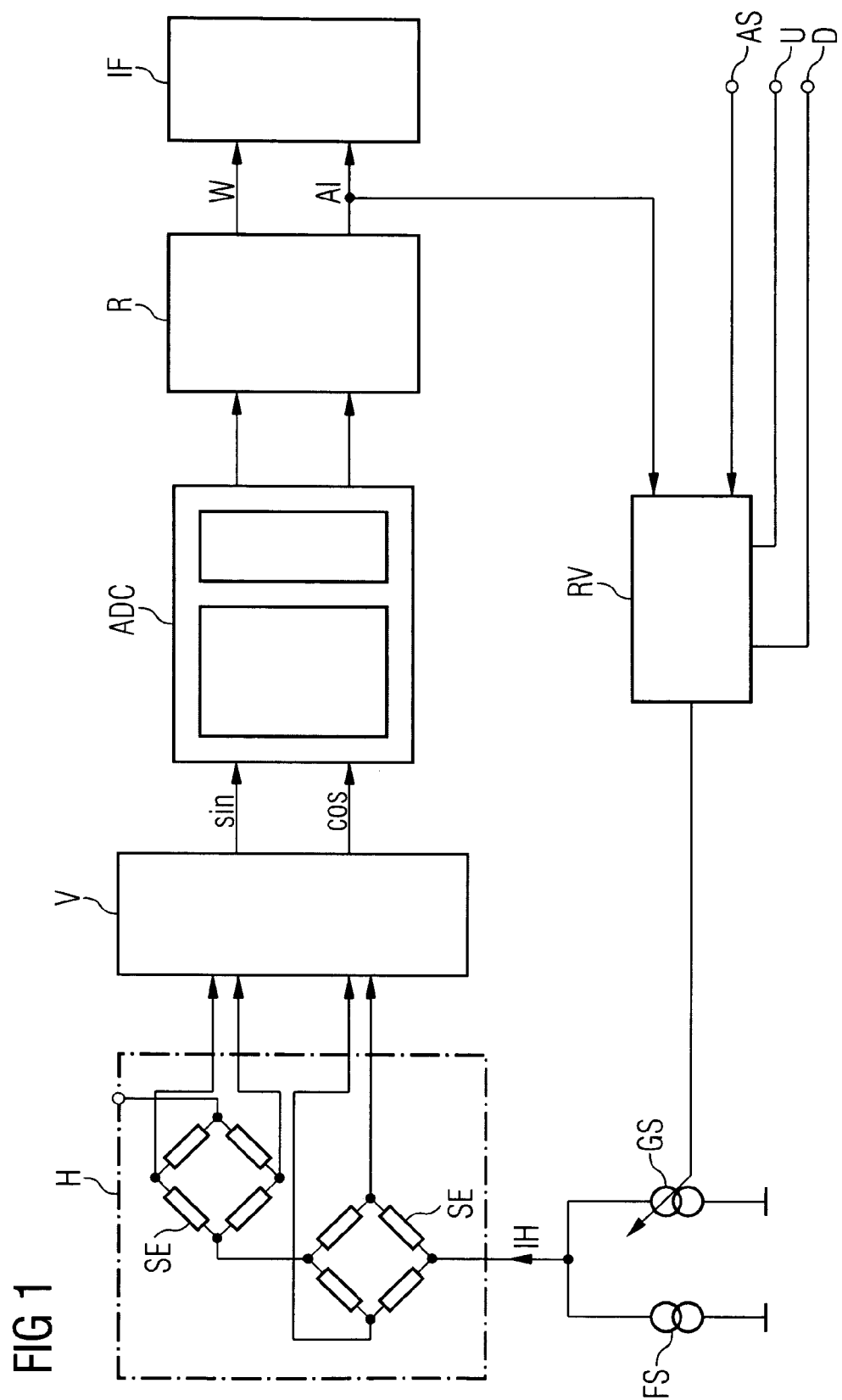
FIG. 1 shows a schematic construction of a magnetic field sensor comprising a Hall element arrangement.

The invention is described below on the basis of a magnetic field sensor comprising a Hall element arrangement. In accordance with FIG. 1, a magnetic field sensor H, in particular a Hall element arrangement, is provided, which preferably comprises a plurality of sensor elements SE. Preferably, four sensor elements in each case are combined to form a sensor arrangement.

The Hall elements of the sensor H are individually supplied by a supply device, or in the exemplary embodiment are fed by a current source containing a fixed current source FS and a controlled current source GS. The fixed current source FS generates a fixed operating current for the Hall elements of the magnetic field sensor H by means of a voltage and current supply device (not specifically illustrated) of the magnetic field sensor. The controlled current source GS generates the controlled current determined by the feedback path. The two partial currents form the Hall current IH.

The two Hall sensor arrangements are oriented such that the measurement signals that they generate are phase-shifted by 90° with respect to one another. If, in one preferred embodiment, the magnetic field sensor is a rotation sensor, the first measurement signal has a sinusoidal profile, while the second measurement signal has a cosinusoidal profile. After preamplification in the preamplifier V, both measurement signals pass to the analog-to-digital converter ADC. The latter carries out the analog-to-digital conversion, for example with the aid of a sigma-delta modulator, so that, after digital filtering that is possibly provided as well, a digitized sine signal and a digitized cosine signal are available at the output of the ADC. The two signals are subsequently combined and processed in the computation device R.

The computation device R executes an algorithm with the digitized signals, so that the desired output signal or output signals is or are available at the output of the computation device. In the example of a rotating field sensor, the angle W is thus available and is fed in at an interface IF, which provides the signal output to external connections or carries out a further processing of the digital angle signal W.

The actual value amplitude AI of the Hall signal from the two measurement signals is available as another output signal of the computation device. For this purpose, the computation device R executes the mathematical relationship $$\sin^2 W + \cos^2 W = 1.$$

The computation device R is usually embodied as a digital signal processor (DSP). In the case of a rotating field sensor, this is also referred to as CORDIC (Coordinate Rotational Digital Computer). One possible algorithm is described in "IEEE Transactions on Circuits and Systems—II: Analog and Digital Signal Processing", Vol. 48, No. 6, June 2001, pp. 548 to 561. It goes without saying that such a CORDIC may also execute other algorithms. Likewise, in the case of a different measurement quantity to be detected by the magnetic field sensor, with the digital processor, it is possible to execute a different algorithm in the DSP.

The actual value amplitude AI of the Hall signal is then fed in a feedback loop to a feedback device RV, which outputs a control signal for controlling the controlled current source GS at its output. In FIG. 1, the feedback device is an amplification device and may also be referred to as AGC (Automatic Gain Control). A desired signal AS for the amplitude of the Hall signal is fed to the feedback device RV at a second input.

Figure 2:
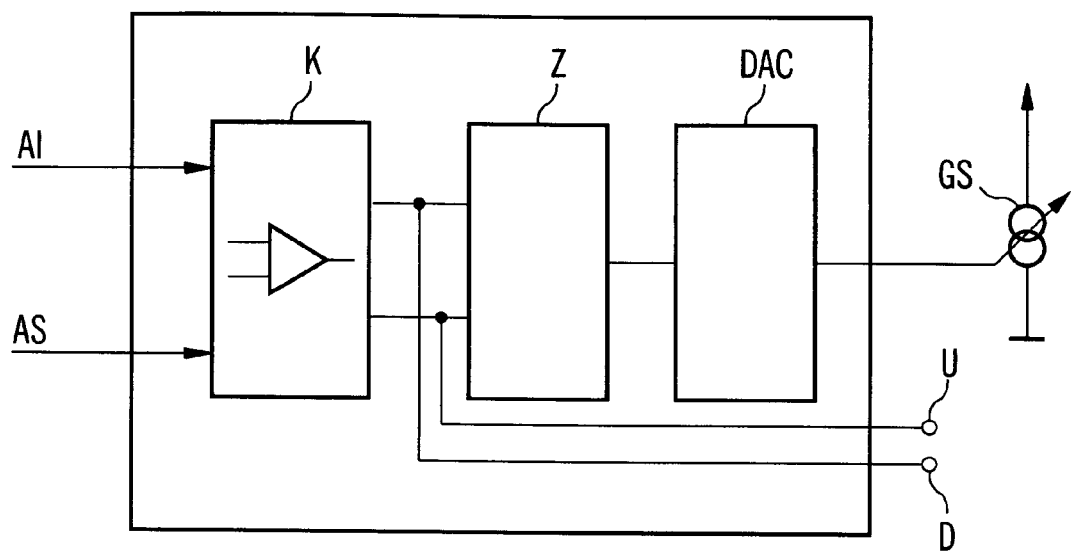
FIG. 2 shows a more detailed schematic illustration of the amplification device.

In accordance with FIG. 2, which illustrates details of the construction of the feedback or amplification device RV, the amplification device contains a digital comparator K, a counter Z and a digital-to-analog converter DAC. The actual values of the amplitude AI and the desired values of the amplitude AS of the Hall signal are fed to the digital comparator. The desired value AS preferably corresponds to an optimum amplitude at the input of the ADC.

The digital comparator K generates an output signal from its two input signals AI and AS, said output signal being fed to a counter Z. The counter Z is embodied as an up/down counter. The value of the counter results for example by counting a clock frequency. In the example of FIG. 2, two output signals U and D of the comparator K are provided at connections of like polarity, of which output U is activated if the counter Z is intended to effect up-counting, while the output D is activated if the counter Z is intended to effect down-counting.

On the output side, the counter value is fed to the digital-to-analog converter DAC, which converts the counter value into an analog signal that in turn controls the controlled current source GS (not specifically illustrated). The controlled current source may, moreover, be embodied in a manner known from the prior art.

The output of the digital comparator K is routed out in parallel with the counter separately at the terminals U and D. The control signals U and D for the counter Z may be used as status information for the magnetic field sensor. Thus, by way of example, in the event of a change in the distance between the magnet and the Hall sensor, it is necessary to readjust the Hall current with the aid of the control loop described. The regulation of the control loop closed with the feedback device RV improves the noise behavior of the magnetic field sensor.

This readjustment of the control loop can be indicated with the aid of the control signals for the counter that are used as status information, because one signal U is characteristic of up-counting and the other signal D is characteristic of down-counting. Consequently, it can be ascertained externally in a simple manner whether the distance between magnet and Hall element has altered and in which direction it has altered. In addition, it is possible, by means of an activation of the two signals U and D, respectively to indicate a counter overflow above the upper permissible value or downward below the lower permissible value, which corresponds to a departure from the control range of the amplification device. In this way, errors can be ascertained in a simple manner.

On account of the control of the amplitude of the Hall signal, the elements of the magnetic field sensor can be optimally adapted to the given conditions of use. It is thus possible to reduce the bit width of the ADC by one or even two bits relative to a non-regulated embodiment. As a result, these elements can be realized in a less complicated fashion and hence more cost-effectively.

Figure 3:
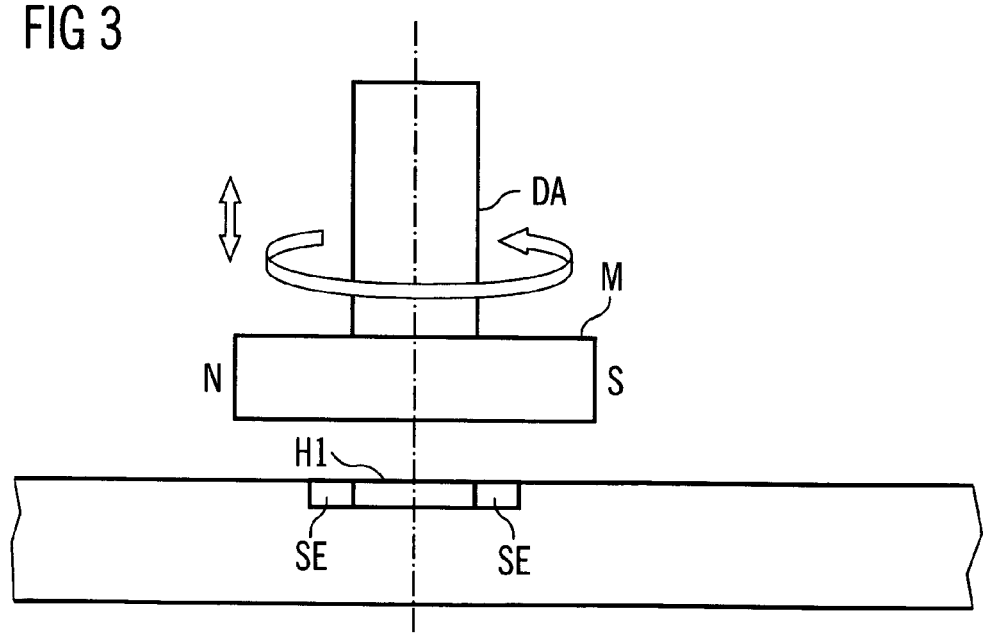
FIG. 3 shows a schematic arrangement of a rotating field sensor.

Finally, FIG. 3 shows for illustration purposes the rotation sensor arrangement known from EP 0916074 B1. On a rotation axis DA, a magnet is fitted above a Hall element H1 with downstream evaluation circuit. The invention now enables an improved measurement and evaluation having a largely independent signal-to-noise ratio relative to changes in distance between magnet and Hall element arrangement. In principle, signal changes based on a Hall element/magnet ratio tilted from the vertical or a non-central Hall element/magnet relationship can also be at least partly compensated for and thus enable a better useful signal.

It should be mentioned that the invention is not restricted to Hall arrangements, rather the concept of the regulated sensor arrangement can also be realized with other sensors based on other physical principles.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A magnetic field sensor, comprising:
   a sensor arrangement, which is supplied by a supply device and generates a sensor signal;
   an evaluation device, to which the sensor signal is fed and which outputs a first output signal corresponding to the amplitude of the sensor signal; and
   a feedback device, to which the first output signal is fed and which controls the supply device such that the first output signal remains substantially constant,
   wherein the evaluation device contains an analog-to-digital converter, which digitizes the sensor signal, and a computation device connected downstream, which generates the first output signal.

2. The magnetic field sensor as claimed in claim 1, wherein the sensor arrangement contains a Hall element arrangement, which is fed by a Hall current and generates a Hall signal as sensor signal, and comprising a feedback device embodied as an amplification device, to which the first output signal is fed and which controls the Hall current.

3. The magnetic field sensor as claimed in claim 1, wherein the first output signal corresponds to the actual value amplitude of the sensor signal and the feedback device sets the supply device with the aid of a predetermined desired value amplitude such that the amplitude of the sensor signal remains constant.

4. The magnetic field sensor as claimed claim 2, wherein the Hall element arrangement detects a rotating magnetic field and a second output signal of the evaluation device corresponds to the rotation angle determined.

5. The magnetic field sensor as claimed in claim 4, wherein the computation device further generates the second output signal.

6. The magnetic field sensor as claimed in claim 2, wherein the Hall signal of the Hall element arrangement contains a first measurement signal and a second measurement signal, which is phase-shifted by 90° relative to the first measurement signal.

7. The magnetic field sensor as claimed in claim 1, wherein the feedback device contains a comparator (K), which compares the first output signal with a reference value, in that a counter is connected downstream of the comparator, the output signal of the comparator being fed to said counter, and in that a digital-to-analog converter is connected downstream of the counter, and converts the output signal of the counter into a control signal for the supply device.

8. A method for the operation of a magnetic field sensor comprising:
   supplying with a supply device a sensor element of the magnetic field sensor; and
   generating with the sensor element a sensor signal that is conditioned by means of an evaluation device to form a first output signal corresponding to the amplitude of the sensor signal, and feeding the sensor signal to a feedback device, which controls the supply device on the output side such that the first output signal remains constant,
   wherein the first output signal is compared with a reference value in a comparator, in that a counter connected downstream of the comparator derives a count from the output signal of the comparator and a digital-to-analog converter converts the output signal of the counter into a control signal for the supply device.

9. The method as claimed in claim 8, wherein the actual value amplitude of the sensor signal is derived from the first output signal and the feedback device sets the supply device with the aid of a predetermined desired value amplitude such that the actual value amplitude of the sensor signal remains constant.

10. The method as claimed in claim 8, wherein a rotating magnetic field is detected by means of the sensor element and a second output signal corresponding to the rotation angle is generated by means of the evaluation device.

11. The method as claimed in claim 8, wherein a sensor element embodied as a Hall element arrangement is arranged in such a way that the Hall signal contains a first measurement signal and a second measurement signal, which is phase-shifted by 90° relative to the first measurement signal.

12. The method as claimed in claim 8, wherein the evaluation device digitizes the sensor signal by means of an analog-to-digital converter, and a computation device connected downstream of the evaluation device generates the first and/or the second output signal.

13. A magnetic field sensor, comprising:
   a sensor arrangement, which is supplied by a supply device and generates a sensor signal;
   an evaluation device, to which the sensor signal is fed and which outputs a first output signal corresponding to the amplitude of the sensor signal; and a feedback device, to which the first output signal is fed and which controls the supply device such that the first output signal remains substantially constant, wherein the feedback device contains a comparator (K), which compares the first output signal with a reference value, in that a counter is connected downstream of the comparator, the output signal of the comparator being fed to said counter, and in that a digital-to-analog converter is connected downstream of the counter, and converts the output signal of the counter into a control signal for the supply device.

* * * * *